United States Patent [19]
Cane et al.

[11] 3,997,872
[45] Dec. 14, 1976

[54] SYNCHRONIZER CIRCUIT

[75] Inventors: David Andrew Cane, Sudbury; David Robert Dutton, Chelmsford; John M. Gunther, Acton, all of Mass.

[73] Assignee: Digital Equipment Corporation, Maynard, Mass.

[22] Filed: July 14, 1975

[21] Appl. No.: 595,647

[52] U.S. Cl. .......................... 340/147 LP; 307/232
[51] Int. Cl.² ................... H04Q 5/00; H03K 17/28
[58] Field of Search ............. 340/147 LP; 307/232, 307/215, 241, 291; 328/99, 137, 152

[56] References Cited
UNITED STATES PATENTS

| | | | |
|---|---|---|---|
| 3,444,470 | 5/1969 | Bolt | 307/232 X |
| 3,515,998 | 6/1970 | Adams | 328/99 X |
| 3,634,769 | 1/1972 | Sleater | 328/152 X |
| 3,668,436 | 6/1972 | Bacon | 307/208 X |
| 3,824,409 | 7/1974 | Patil | 340/147 LP X |

*Primary Examiner*—Harold Pitts
*Attorney, Agent, or Firm*—John M. Gunther; Thomas C. Siekman; Arthur Fisher

[57] ABSTRACT

When two asynchronous signals may occur at approximately the same time, only one of the signals being able to control consequent events, a circuit accounts for the conflict situation by selectively adding a delay until the conflict situation has settled. While the circuit does not determine which asynchronous event may control, the selective delay extends the time for the decision to be made. This circuit provides high reliability while minimizing delays and eliminates the need for indiscriminately adding a delay to each asynchronous event so as to resolve conflict situations. The circuit has particular applicability to volatile memory systems wherein conflict between processor requests and refresh requests to memory occur and allows processor requests to proceed with minimum delay in nearly all situations.

15 Claims, 3 Drawing Figures

SYNCHRONIZER CIRCUIT

FIELD OF THE INVENTION

This invention relates to synchronizer circuits and more particularly to a synchronizer circuit which is responsive to two asynchronous events which may occur simultaneously, one of the asynchronous events blocking the occurrence of the other.

DESCRIPTION OF THE PRIOR ART

The typical problem faced in the prior art involves two asynchronous input signals into one decision element. Each signal enables a certain different set of subsequent events to occur. From these two input signals, two output signals are provided. One of the output signals identifies which input signal had arrived earlier while the second output signal provides a pulse which enables the sensing of the first output signal. Normally the time for making a decision given only one input signal is fixed and is able to be determined by specifications provided by the manufacturer of the decision element. A problem arises when the two input signals, which are provided into a decision element, occur almost simultaneously. The decision element may oscillate or enter into a metastable state before it settles down and provides the first output signal. In this case, this fixed time of the decision element for responding to the input signal is lengthened. As a result, the decision may not have been made prior to generation of the sound output signal. Obviously, erroneous operations will ensue.

In order to overcome this problem, one solution in the prior art is to add a long enough delay, by a delay element, such that the conflict situation has resolved itself and the sensing occurs after this long period to determine what subsequent events should occur. However, this becomes inappropriate since every decision is delayed. Over the long range of events, only a small percentage of input signals would occur at approximately the same time. By delaying each input signal, the overall throughput for rendering decisions by the decision element is lengthened with a corresponding increase in the throughput time.

While attempting to switch in a fixed delay may overcome the problem of oscillation, false start occurrences are not eliminated. In this situation, an initial output pulse may be generated, but because of the contention involving simultaneous occurrence of two input signals, this initial pulse may not be controlling. This false start may be sufficient such that an erroneous subsequent event may occur. It is desirable to eliminate any such false output pulses from occurring, but the switched fixed delay does not accomplish this..

Moreover, it is desirable that the circuit have the capability of resolving which input signal controls with the same degree of reliability that would occur when only one input signal is provided. This requires that a time period be introduced which accounts for any unreliable situations. This is particularly true in the instant situation wherein one signal causes a different sequence of events than another mutually exclusive signal. As used herein, reliability means that a subsequent event is initiated only after the decision has been made. The present invention overcomes these problems and allows the same degree of reliability for conflict situations as it does with non-conflict situations.

The synchronizer problems stated above have significant applicability when taken in conjunction with volatile memory elements. In volatile memory systems, for example, MOS memory system, information is stored by storage elements which tend to lose their charge over time. As a result, there is a need to have an automatic mechanism which periodically refreshes, amplifies, and restores the information of each storage element. The frequency at which these refresh cycles are performed is chosen to ensure that no cell will have discharged to the point of losing information. These refresh cycle requests, however, may conflict with processor requests wherein information may be read from or written into memory.

The basic synchronizer problem for volatile memory thus involves making sure that either the processor request or the refresh request is selected in addition to making sure that the operation based on the request is only initiated after the decision element has stabilized. The circuit of the present invention optimizes the basic synchronizer problem and adapts well to the synchronizer problem in MOS memory elements.

OBJECTS OF THE INVENTION

It is a primary object of the invention to provide a circuit which accounts for the synchronizer problem and is low cost, simple and efficient.

It is another object of the invention to provide a synchronizer circuit which maximizes throughput of event occurrences by providing for different delays, each delay based on the timing differences between the event occurrences.

It is a further object of the invention to provide a circuit which not only minimizes the delay involved for making a reliable decision when a conflict situation between two events occurs but also and provides a continuous transition between delayed and non-delayed situations.

It is yet a further object of the invention to maximize performance of volatile memory circuits.

BRIEF DESCRIPTION OF THE DRAWINGS

The foregoing and other objects, features and advantages of the invention will be apparent from the following detailed description taken together with the accompanying drawings in which.

SUMMARY OF THE INVENTION

The synchronizer circuit of the present invention includes means for indicating the occurrence of at least two asynchronous events. If the more frequent event occurs outside the period of possible conflict, a non-delayed, first output signal is generated which enables immediate sensing of the other output signal from the decision element. If there is a contention situation in which both asynchronous input signals occur simultaneously, a delayed first output signal is generated which enables sensing of the other output signal of the decision element after the decision element has had time to settle down. The invention has particular applicability where the less frequent asynchronous event is always delayed.

DETAILED DESCRIPTION OF THE PREFERRED EMBODIMENT

While the circuit disclosed herein is useful in a variety of different contexts for solving the synchronizer problem, its basic features are disclosed in the best mode of the invention which involves the refreshing of a volatile memory. Obviously, whenever a conflict situation arises in a circuit, the instant invention may be applicable thereto. Hence, it is not intended to be limited to the best mode situation described herein.

Figure 1:
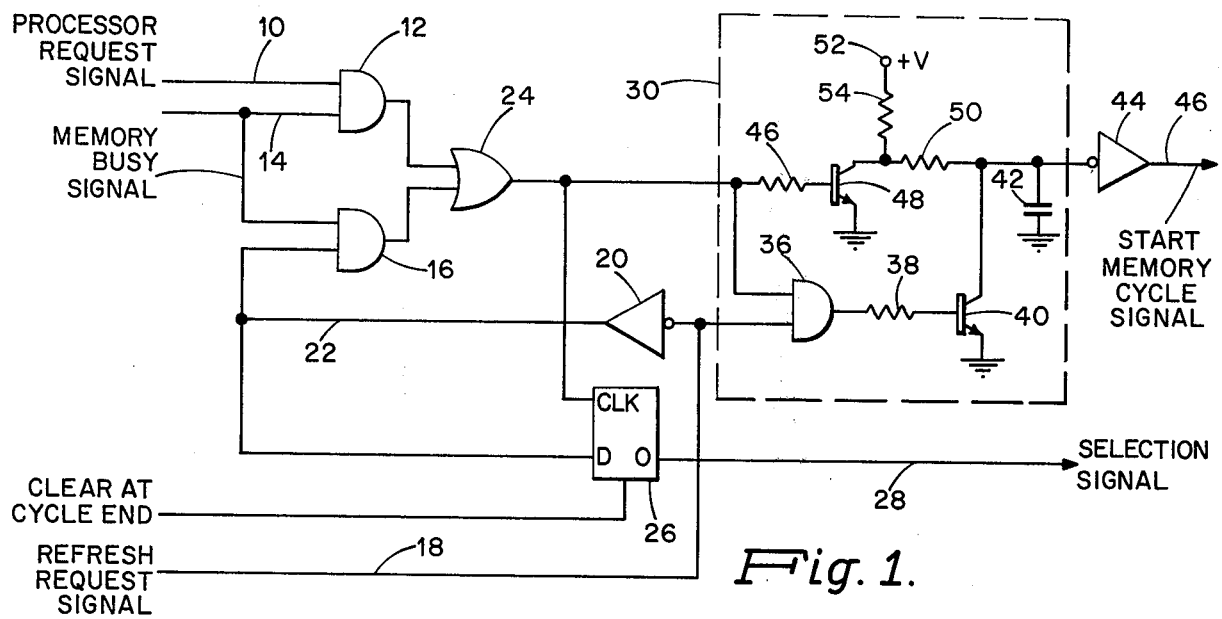
FIG. 1: is a schematic diagram of circuitry resolving a synchronizer problem.

Referring to FIG. 1, a processor request signal is provided over line 10 to AND gate 12. Unless otherwise stated, a signal is assumed to be high (true) when generated. A processor request signal is generated each time that information from memory (not shown) is to be retrieved (read) or when information is to be stored into memory (write).

AND gate 12 has a second input which is a memory busy signal over line 14. Busy signal 14 is a protective signal which is known in the art as cycle lockout. In the situation wherein several immediate requests for memory are made, busy signal 14 ensures that these requests are not processed until the previous request has been fulfilled. The busy signal is high when memory is not being referenced, and when memory is being referenced the busy signal over line 14 is low.

Busy signal 14 also has an input to AND gate 16 which has as its second input a refresh signal 18 transferred through inverter 20, line 22 to AND gate 16. The refresh signal occurs when the volatile memory should be refreshed. The refresh request signal 18 may occur at selected predetermined intervals. With respect to the processor request signal, the refresh request signal is considered to be asynchronous since it is not known when it occurs with respect to the processor request signal.

The signal over line 18 is typically high when no refresh request is made. When a refresh request signal for the volatile memory is generated, a low signal is provided over line 18 which is inverted by amplifier 20 so as to provide a high signal to AND gate 16 via line 22. If there is no memory cycle being performed, busy signal 14 will also be high and as a result, a high signal from AND gate 16 will be provided to OR gate 24.

OR gate 24 is responsive to either a processor request signal over line 10 or a refresh request signal over line 18 when the memory is not in use. The output of OR gate 24 is provided to a decision element 26 which in the particular situation is a flip flop 26.

Flip flop 26 has its clear input enabled at the end of each memory cycle. This clear input results in the output of flip flop 26 being low. Since the processor request signals occur more frequently then the refresh request signals, when a processor request signal is granted, then there are no propagation delays of decision element 26. As a result, overall throughput for the system is increased. The clock input of flip flop 26 is responsive to both processor and refresh request signals. When the clock input is enabled, flip flop 26 then is enabled to make a decision based on its data input. The data input of flip flop 26 is connected to the refresh request signal which, when enabled, changes the output signal of the flip flop 26 to indicate that a refresh request has been granted. Thus, the output of flip flop 26 is normally low indicating a processor request will be granted; whereas, if it is high in response to the data input over line 22, then the output from flip flop 26 indicates that a refresh request signal will be granted. The output signal is provided over line 28 and is called a selection signal.

The output of OR gate 24 also enables a selective delay circuit 30. The purpose of selective delay circuit 30 is to provide a signal which starts the memory cycle. Upon the memory cycle signal being given over line 46, the selection signal generated over line 28 is sensed. If the selection signal is low, it enables other logic circuits (not shown) to perform a processor request; if the selection signal is high, it enables other logic circuits to perform a refresh request. The memory cycle signal occurs in a variable time period because it is possible that a contention situation may arise, i.e. both a processor request signal and a refresh request signal may occur at the same time.

More particularly, the output of OR gate 24 is coupled to an AND gate 36 which has as its other input the refresh request signal over line 18. Assuming that a processor request signal 10 has occurred and there is no refresh request signal, then the output of OR gate 24 will be high and the refresh request signal over line 18 will be high. This enables AND gate 36 to provide a high signal through resistor 38 enabling NPN transistor 40. Transistor 40 has its emitter connected to ground and its collector coupled to energy storage element 42, which in this particular application is a capacitor. When capacitor 42 reaches a cerain low level inverter amplifier 44 is enabled, thereby providing a start memory cycle signal over line 46. This memory cycle signal enables the sensing of the output of the selection signal 28 as is well known in the art. Based on the selection signal, the subsequent events to be performed are enabled. For example, if the selection signal is high, i.e. a refresh request, the volatile memory elements in the memory will be refreshed. If the selection signal is low, i.e. a processor request signal, an information exchange to or from a particular address in memory will be executed.

The output of OR gate 24 is also provided to a second delay circuit which comprises resistor 46, NPN transistor 48 and resistor 50. When a processor request signal or a refresh request signal is generated, resistor 46 transfers a high signal to transistor 48. Transistor 48 also has its emitter connected to ground and its collector connected to energy storage element 42 via resistor 50. Because of the series connection between resistor 50, transistor 48 and energy storage element 42, a much slower discharge of energy storage element 42 occurs. While transistor 48 is enabled for every cycle, since it discharges memory element 42 significantly slower than transistor 40, it only has a small impact on the energy level of energy storage element 42 when transistor 40 is discharging element 42.

Voltage source 52 is used to charge up capacitor 42. More specifically, when memory busy signal occurs. the voltage source 52 via resistors 50 and 54 charges up capacitor 42. With capacitor 42 charged, the next memory cycle is ready to begin.

The operation of FIG. 1 will now be explained in detail. When only a processor request signal over line 10 is generated and there is no other memory operation, AND gate 12 is enabled which provides a signal through OR gate 24 to the clock input of flip flop 26 such that a selection signal over line 28 is generated. Concurrently, the output of OR gate 24 also provides an input to AND gate 36 and transistor 48. AND gate 36 is enabled since there is no refresh request signal over line 18 and, therefore, transistor 40 quickly discharges energy storage element 42. Also, OR gate 24 enables transistor 48 to discharge energy storage element 42. As a result, energy storage element 42 is quickly discharged thereby having sense amplifier 44 generate a start memory cycle signal which enables the sensing of selection signal 28. The selection signal 28 is low since the data input to flip flop 28 has a low signal.

If only a refresh request signal is provided over line 18, inverter 20 changes the low signal to a high signal and enables AND gate 16 to provide a high signal to OR gate 24. OR gate 24 provides a signal to the clock input of flip flop 26. The data input to flip flop 26 has a high signal since it is coupled to line 22 which has the high refresh request signal. As a result, selection signal 28 is high indicating that a refresh of the volatile memory is needed.

Figure 3:
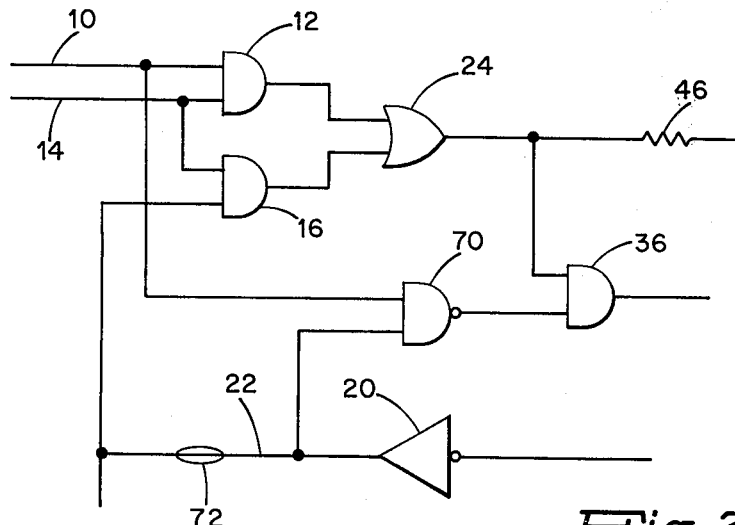
FIG. 3: is an alternative embodiment of circuitry enabling the selective delay circuit in FIG. 1.

The low refresh request signal over line 18 is also provided to AND gate 36 inhibiting AND gate 36 from enabling transistor 40. As a result, only transistor 48 in series with resistor 50 is enabled, thereby providing for a slow discharge of energy storage element 42 with a consequent delay in the start memory cycle signal over line 46. This delay of the start signal over line 46 results in a delay of the sensing of the high selection signal indicating a refresh request. Since this refresh request occurs much less frequently than the processor request, in the preferred embodiment shown in FIG. 1, a longer delay is provided for each refresh request operation. This does not significantly increase throughput time because of the low frequency of occurrence of the refresh request and provides for the use of a simple circuit. FIG. 3, infra, may be used when both input signals occur with the same frequency or if additional time saving is required.

It is assumed that the combined minimum propagation delay of AND gate 16 and OR gate 24 are greater than the set up time required by the data input of flip flop 26 to be responsive to the clock input of flip flop 26. If this assumption is not true, for example, if future technology reduces the propagation delay time of AND and OR gates, then a delay element (not shown) may be added before AND gate 16 to ensure no conflict.

Flip flop 26 normally has to respond to only one input signal, i.e. either the processor or refresh request signal. However, a conflict situation may arise when the D input of flip flop 26 changes just before the clock input is enabled. Since the clock input enables the output of flip flop 26 to be provided over line 28, when this situation occurs, flip flop 26 may enter a metastable state which does not immediately signal which event occurred.

Each decision element, whether it be a flip flop or any other device, has certain defined parameters which identify its performance characteristics. These parameters indicate, in one example, that if one input, for example the clock input, is enabled, then there is a certain time period before and possibly after when a change in the other input, which in this situation would be the data input, results in a conflict situation. Stated differently, during the time period immediately preceding the clock input signal, if there is a change in the data input, it is unknown what output signal the decision element may provide.

For the particular flip flop being discussed, this time period is typically three nanoseconds prior to the clock input occurring. If a data input signal arrives in this three nanosecond interval prior to the clock signal occurring, the manufacturer's performance characteristics are not applicable, i.e. it is not known whether the output will oscillate, enter a metastable state, or change its initial response. In order to solve the problem, it is desirable to sense the output after a longer period of time. If this is done, it is very likely that the output will have settled down. The apparatus of the present invention provides for this delay.

More specifically, once the situation of conflict arises, it is necessary to allow the flip flop 26 time to settle so that its output selection signal 28 is known to be valid. This is accomplished by delaying the output of sense amplifier 44 which controls the initiation of cycle activity. With this added delay, the selection signal is sensed later in time. As a result, the time for the flip flop 26 to settle is increased with the likelihood that the output signal is valid.

For FIG. 1, the only possible situation when the conflict situation would arise is when a processor request has been generated and approximately simultaneously, or immediately thereafter, a refresh request signal is also generated. Because the propagation delays of AND gate 16 and OR gate 24 are longer than the conflict delay between the clock input and data input of flip flop 26, the conflict situation can only occur when the refresh request signal interrupts the processor request signal. More particularly, because the processor request signal has been generated, OR gate 24 is enabled to provide a signal to the clock input of flip flop 26. However, almost simultaneously, or very shortly before, i.e. within the three nanosecond window of the data input prior to clock input of flip flop 26, a refresh request signal has also been generated. This refresh request signal over line 18 is provided to the D input of flip flop 26 via inverter amplifier 20 and line 22. This signal will be changing the energy level at the D input and, consequently, may cause the conflict situation.

For this situation, AND gate 36 is not enabled since the refresh request signal is low. Because of the propagation delay involved, the refresh signal reached AND gate 36 prior to the processor request signal. As a result, transistor 40 is never enabled and hence, the only discharging of energy storage means 42 is by transistor 48. This will result in a long delay time before the start memory signal 46 is given. As a result, flip flop 26 has time to settle. At the end of this time the output of flip flop 26 should provide a selection signal 28. It should be noted that the delay does not cause a selection of one output signal or the other, but rather only allows sufficient time for the flip flop 26 to settle so that a reliable output signal is provided.

Obviously, an energy storage element may discharge in any variable period. It is possible that prior and subsequent to the conflict time period some overlap of signals will occur. This overlap will not result in a conflict such as that which occurs for the conflict time period, described supra, but the overlap will lengthen the initiation of start memory cycle signal over line 46. This situation arises, for example, in the instant application, when the processor cycle has been initiated and energy storage element is being rapidly discharged. Prior to reaching the energy level which enables sense amplifier 44, the refresh request signal disables AND gate 36 and, therefore, transistor 40. For this condition, transistor 48 will continue to discharge element 42 until it enables sense amplifier 44. What has occurred is a delay in generating the start memory cycle signal but no conflict situation has arisen so the processor request signal is granted.

Figure 2:
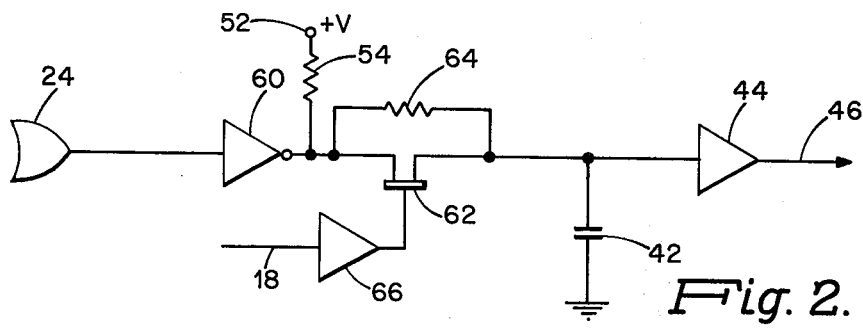
FIG. 2: is an alternative embodiment of the selective delay circuit utilized in FIG. 1.

Referring now to FIG. 2, a variation of FIG. 1 in terms of providing a delay is shown. Again, in FIG. 2, the energy storage means 42 is a capacitor which, when it reaches a certain charge level, enables sense amplifier 44 to provide the start signal which controls the address presented to memory. Discharging of energy storage element 42 is controlled by an FET transistor 62. Transistor 62 may either discharge element 42 quickly or slowly depending upon its gating.

More specifically, FET 62 in its normal operation is controlled by the refresh synchronization signal over line 18 through amplifier 66. Amplifier 66 conditions the drive signal provided over line 18. If this signal is not present, i.e. when the refresh signal is high, FET 62 is enabled and thereby discharges capacitor 42 rapidly through amplifier 60. If, however, the refresh signal 18 is provided, this refresh signal being low, then the FET 62 is disabled and as a result, amplifier 60 must discharge capacitor 42 via resistor 64, thereby providing for a delay in the discharging of element 42. Consequently, the start signal is delayed and the sensing of the selection signal over line 28 is also delayed.

Referring to FIG. 3, the same components as provided in FIG. 1 are shown. In addition, a NAND gate 70 is provided which has as its inputs the processor request signal and the refresh request signal and its output is coupled to the input of AND gate 36. In addition, a delay element 72 is added between output of inverter amplifier 20 and the input of AND gate 16 and the data input to decision element 26 so as to ensure that the necessary propagation delay times do not cause a conflict situation.

The circuit of FIG. 3 is appropriate for those situations where the two input signals may occur with the same frequency. In this particular example, FIG. 3 eliminates the added delay provided for every refresh request signal in FIG. 1. Stated differently since NAND gate 70 is only enabled when both processor and refresh request signals are provided nearly simultaneously, its low output signal only disables AND gate 36 for conflict situations. When either a processor request or a refresh request is provided, NAND gate 70 is not enabled. As a result, it will have a high output signal to AND gate 36. Since AND gate 36 is also responsive to the output of OR gate 24, there will be a fast discharge by transistor 40 except for the conflict situation.

Obviously, many forms of the invention may be practiced, however, the concept of introducing a selective delay which accounts for any oscillation of the decision element is provided. Thus, other energy storage elements may be introduced such as voltage control delays, integrated circuit one shots, and electronically variable resistors. Moreover, the remaining portions of the circuit may be changed and decision element 26 may be any type of circuit which involves the determination of one event over the other. In addition, the use of NAND, AND and OR gates as well as NPN transistors is only exemplary and any known substitutes may be used therefore.

Other uses will become apparent to those of ordinary skill in the art. For example, the above circuit is also applicable to synchronizing I/O requests with processor requests. Therefore, it is desired to be limited only as provided by the claims hereinafter recited.

We claim:
1. A circuit for resolving the conflict created by signals capable of occurring at essentially the same time, said circuit comprising:
   A. first means for indicating the occurrence of a first signal;
   B. second means for indicating the occurrence of a second signal;
   C. means coupled to said first and said second means for enabling an output signal for identifying the occurrence of said first or said second signal;
   D. means coupled to said first and said second means for providing a third signal which allows sensing of said output signal; and
   E. said providing means including means for selectively delaying said third signal in response to the occurrences of said second signal in relation to said first signal.
2. A circuit as defined in claim 1 wherein:
   A. said providing means includes energy storing means for generating said third signal, said third signal being initiated when said energy storing means reaches a certain energy level; and
   B. wherein said selective delay means alters the rate of change of the energy level of said energy storing means, said selective delay means in response to said first signal altering said energy level of said energy storing means at a first rate, said selective delay means in response to said second signal altering said energy level of said energy storing means at a second rate, whereby said sensing of said output signal occurs after said third signal is generated.
3. A circuit as defined in claim 2 wherein said selective delay means is initially responsive to said first means, said second means inhibiting said selective delay means from altering said energy level at said first rate, such that said energy level is changed at said second rate, said second rate being much slower than said first rate such that a longer changing of said energy level occurs when said second signal from said second means occurs almost simultaneously with said first signal from said first means.
4. A circuit as defined in claim 2 wherein said selective delay means includes:
   A. first logic means responsive to said first signal from said first means and the absence of said second signal from said second means for altering said energy level of said energy storing means at the first rate;
   B. second logic means responsive to either said first or said second means for altering said energy level of said energy storing means at the second rate;
   C. said first and second logic means being enabled in response to said first means such that both said first and second logic means effect said energy level of said energy storing means; and
   D. said first logic means being inhibited in response to said second means such that only said second logic means effect said energy level of said energy storing means, whereby said first and said second logic means continuously expand or contract the time at which said third signal is generated.
5. A circuit as defined in claim 4 wherein:
   A. said first logic means includes a first transistor;
   B. said second logic means includes a resistor in series with a second transistor; and
   C. said energy storing means is a capacitor.
6. A circuit as defined in claim 2 wherein said selective delay means includes a field effect transistor, said field effect transistor effecting said energy level of said energy storing means at the first rate in response to said first signal and effecting said energy level of said energy storing means at the second rate in response to said second signal.

7. A circuit as defined in claim 1 wherein said providing means includes a decision element having at least two inputs and at least one output, one of said inputs responsive to the occurrence of more than one event, said decision element characterized by requiring a certain energy level at the other of said inputs in order to provide said output signal in response to said one input, said decision element when said other input receives a plurality of signals, within a predetermined period of time at said one input characterized by uncertain performance characteristics.

8. A circuit as defined in claim 7 wherein said decision element is a flip flop having a clock and data input and an output having more than one state, said output signal from said flip flop normally occurring within a certain time of receiving said clock input, said data input sensing said first and said second signal which when said signals occur within substantially the same period causes said output signal to be uncertain.

9. A circuit as defined in claim 8 and further including third means for inhibiting said first and second means, said third means enabled subsequent to said third signal being generated.

10. A circuit as defined in claim 8 wherein said providing means has said output signal in a first state when said first signal controls and said output signal in a second state when said second means controls.

11. A circuit for resolving a conflict created in a decision element when asynchronous signals occur at approximately the same time, said circuit comprising:
   A. first means for indicating the occurrence of a first signal;
   B. second means for indicating the occurrence of a second signal;
   C. said decision element coupled to and responsive to said first and said second means for providing an output signal identifying the reception of one of said signals; and
   D. means responsive to said first and second means for selectively delaying the sensing of said output signal, said selective delaying means including:
      i. means for generating a third signal;
      ii. means for altering the time when said third signal is generated;
      iii. means responsive to said first and second signals for providing a fourth signal;
      iv. said altering means in response to the absence of said fourth signal and the presence of said first or said second signal providing said third signal relatively quickly; and
      v. said altering means in response to the presence of said fourth signal providing said third signal relatively slowly, such that said conflict in said decision element may be resolved.

12. A circuit as defined in claim 11 wherein said providing means is a NAND gate and said enabling means is an AND gate, said NAND gate disabling said AND gate when said first and second signals are presented nearly simultaneously, whereby said selective delaying means increases the time before said output signal of said decision element is sensed in order that any conflict in said decision element may be resolved.

13. In a computer system having a memory which requires periodic refreshing, said memory capable of being accessed for individual processor requests and also for refresh requests, said memory, upon a memory cycle signal being initiated being responsive to an output signal indicating either a processor request or a refresh request, a circuit for resolving a conflict for memory access between substantially concurrent request by said processor or refresh request, said circuit comprising:
   A. first means responsive to said processor request for providing a first signal;
   B. second means responsive to said refresh request for providing a second signal;
   C. third means responsive to said first and said second signals for providing said output signal which identifies the request being executed; and
   D. fourth means responsive to one of said first or second signals for providing a third signal which enables said output signal to be sensed, said fourth means selectively delaying sensing of said third signal when said processor request and said refresh request occur nearly simultaneously.

14. A circuit as defined in claim 13 and further including:
   A. fifth means responsive to memory being accessed for inhibiting said first and second means; and
   B. sixth means responsive to said second signal for inhibiting said fourth means being responsive to said first means.

15. A circuit as defined in claim 2 and further including:
   A. means coupled to said providing means for restoring said energy level to said energy storing means.

* * * * *